United States Patent
Kodera et al.

(10) Patent No.: US 12,030,092 B2
(45) Date of Patent: Jul. 9, 2024

(54) SUBSTRATE CLEANING METHOD AND SUBSTRATE CLEANING APPARATUS

(71) Applicant: EBARA CORPORATION, Tokyo (JP)

(72) Inventors: Kenji Kodera, Tokyo (JP); Keisuke Uchiyama, Tokyo (JP); Satoru Yamamoto, Tokyo (JP); Hokuto Yamanobe, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 9 days.

(21) Appl. No.: 17/636,299

(22) PCT Filed: Jul. 13, 2020

(86) PCT No.: PCT/JP2020/027253
§ 371 (c)(1),
(2) Date: Feb. 17, 2022

(87) PCT Pub. No.: WO2021/033460
PCT Pub. Date: Feb. 25, 2021

(65) Prior Publication Data
US 2022/0288650 A1    Sep. 15, 2022

(30) Foreign Application Priority Data
Aug. 20, 2019   (JP) .................................. 2019-150159

(51) Int. Cl.
*B08B 3/02*   (2006.01)
*H01L 21/67*   (2006.01)
*H01L 21/687*   (2006.01)

(52) U.S. Cl.
CPC .............. *B08B 3/024* (2013.01); *B08B 3/022* (2013.01); *H01L 21/67051* (2013.01); *H01L 21/68728* (2013.01)

(58) Field of Classification Search
None
See application file for complete search history.

(56) References Cited

U.S. PATENT DOCUMENTS

| | | | |
|---|---|---|---|
| 2012/0247506 A1 | 10/2012 | Tanaka et al. | |
| 2015/0348806 A1* | 12/2015 | Ishibashi | H01L 21/67046 15/103.5 |
| 2017/0323809 A1 | 11/2017 | Fukaya et al. | |

FOREIGN PATENT DOCUMENTS

| | | | | |
|---|---|---|---|---|
| CN | 208800297 U | * | 4/2019 | ............. B05B 12/32 |
| JP | 2006-093497 A | | 4/2006 | |

(Continued)

OTHER PUBLICATIONS

PE2E translation of CN 208800297 (Year: 2023).*

(Continued)

*Primary Examiner* — Eric W Golightly
(74) *Attorney, Agent, or Firm* — BakerHostetler

(57) ABSTRACT

The present invention relates to a substrate cleaning method and a substrate cleaning apparatus for cleaning a substrate, such as a wafer. The substrate cleaning method includes: holding a periphery of a substrate (W) with holding rollers (6); rotating the substrate (W) about its central axis by rotating the holding rollers (6) about their respective central axes; delivering a two-fluid jet from a two-fluid jet nozzle (2) to a surface of the substrate (W) while moving the two-fluid jet nozzle (2) in a radial direction of the substrate (W), the two-fluid jet (2) being composed of a mixture of a first liquid and a gas; and when the two-fluid jet is being delivered to the surface of the substrate (W), delivering a fan-shaped jet of a second liquid from a spray nozzle (3) to the surface of the substrate (W) to form a flow of the second liquid on the surface of the substrate (W). The fan-shaped jet is located away from the two-fluid jet.

7 Claims, 7 Drawing Sheets

(56) References Cited

FOREIGN PATENT DOCUMENTS

| | | |
|---|---|---|
| JP | 2015-201627 A | 11/2015 |
| JP | 2017-147334 A | 8/2017 |

OTHER PUBLICATIONS

International Patent Application No. PCT/JP2020/027253; Int'l Search Report; dated Sep. 24, 2020; 4 pages.
European Patent Application No. 20854337.1; Extended Search Report; dated Jul. 10, 2023; 7 pages.

* cited by examiner

SUBSTRATE CLEANING METHOD AND SUBSTRATE CLEANING APPARATUS

TECHNICAL FIELD

The present invention relates to a substrate cleaning method and a substrate cleaning apparatus for cleaning a substrate, such as a wafer.

BACKGROUND ART

In recent years, devices such as memory circuits, logic circuits, and image sensors (for example, CMOS sensors) have become highly integrated. In the process of forming these devices, foreign matter, such as fine particles and dust, may be attached to the devices. Foreign matter attached to the devices may cause a short circuit between interconnects and may cause circuit malfunction. Therefore, in order to improve the reliability of the devices, it is necessary to clean a wafer on which the devices are formed to remove the foreign matter from the wafer. Foreign matter, such as fine particles and dust as described above, may also be attached to a back surface (non-device surface) of the wafer. When such foreign matter is attached to the back surface of the wafer, the wafer is separated from a stage reference plane of an exposure apparatus, or the wafer surface is inclined with respect to the stage reference plane, resulting in patterning shift or focal-length shift.

In view of this, there is a method of emitting a two-fluid jet composed of a fluid mixture of liquid and gas to a surface (front side or back side) of a wafer to clean the surface of the wafer. When this two-fluid jet cleaning is performed, a periphery of the wafer is held by claws of chucks, and the two-fluid jet is emitted from a nozzle onto the surface of the wafer while the chucks are rotated together with the wafer about a central axis of the wafer. Further, the nozzle oscillates (or scans) in a radial direction of the wafer, so that the two-fluid jet can be supplied over the entire surface of the rotating wafer.

However, when the nozzle is located above the periphery of the wafer, the two-fluid jet collides with the chuck claws and as a result, a large amount of liquid may be scattered. Therefore, in order to prevent such scattering of the liquid, a cleaning device of a type configured to hold a periphery of a wafer with a plurality of rollers instead of the chuck and rotate these rollers to thereby rotate the wafer has been proposed. According to this type of cleaning device, positions of the rollers themselves are fixed, so that the two-fluid jet does not collide with the rollers even when the nozzle is located above the periphery of the wafer.

CITATION LIST

Patent Literature

Patent document 1: Japanese laid-open patent publication No. 2017-147334

SUMMARY OF INVENTION

Technical Problem

However, compared to the chuck type, the roller-type cleaning device cannot rotate the wafer at a high speed (usually, a maximum of 150 $min^{-1}$). Therefore, in order to clean the entire surface of the wafer, it is inevitably necessary to lower the moving speed of the nozzle. As a result, a time required for the nozzle to make one reciprocation (one scan) increases, and a portion of the wafer that is not in contact with the liquid becomes semidry. Further, since the rotation speed of the wafer is low, a strong centrifugal force does not act on the liquid on the wafer, and the particles lifted by the two-fluid jet may remain on the wafer.

Therefore, the present invention provides a substrate cleaning method and a substrate cleaning apparatus capable of preventing a substrate, such as a wafer, from becoming semidry and reliably removing particles lifted by a two-fluid jet from a surface of the substrate.

Solution to Problem

In one embodiment, there is provided a substrate cleaning method comprising: holding a periphery of a substrate with holding rollers; rotating the substrate about its central axis by rotating the holding rollers about their respective central axes; delivering a two-fluid jet from a two-fluid jet nozzle to a surface of the substrate while moving the two-fluid jet nozzle in a radial direction of the substrate, the two-fluid jet being composed of a mixture of a first liquid and a gas; and when the two-fluid jet is being delivered to the surface of the substrate, delivering a fan-shaped jet of a second liquid from a spray nozzle to the surface of the substrate to form a flow of the second liquid on the surface of the substrate, the fan-shaped jet being located away from the two-fluid jet.

In one embodiment, an angle of the spray nozzle with respect to the surface of the substrate is in a range of 15° to 45°.

In one embodiment, a width of the fan-shaped jet is at least three-quarters of a radius of the substrate.

In one embodiment, a direction of the fan-shaped jet is oriented toward an outside of the substrate.

In one embodiment, the spray nozzle is located above the substrate.

In one embodiment, delivering the fan-shaped jet comprises delivering the fan-shaped jet from the spray nozzle to the surface of the substrate to form the flow of the second liquid on the surface of the substrate while moving the spray nozzle.

In one embodiment, the two-fluid jet nozzle and the spray nozzle are fixed to a common arm.

In one embodiment, there is provided a substrate cleaning apparatus comprising: holding rollers having substrate holding surfaces configured to hold a periphery of a substrate, the holding rollers being rotatable about their own central axes; a two-fluid jet nozzle configured to form a two-fluid jet composed of a mixture of a first liquid and a gas; a fan spray nozzle configured to form a fan-shaped jet of a second liquid; and a nozzle moving device configured to translate the two-fluid jet nozzle, the two-fluid jet nozzle and the fan spray nozzle being oriented toward a region surrounded by the substrate holding surfaces, and the fan spray nozzle being oriented in a direction in which the fan-shaped jet does not collide with the two-fluid jet.

In one embodiment, an angle of the fan spray nozzle with respect to a plane extending through the substrate holding surfaces is in a range of 15° to 45°.

In one embodiment, the fan spray nozzle is configured to form the fan-shaped jet having a width of at least three-quarters of a radius of the substrate.

In one embodiment, the nozzle moving device includes an arm holding the two-fluid jet nozzle and the fan spray nozzle.

Advantageous Effects of Invention

According to the present invention, the fan-shaped jet forms a uniform flow of the second liquid over a large area of the surface of the substrate. This flow of the second liquid can flush out the particles that have been once lifted by the two-fluid jet, and can prevent the substrate from becoming semidry.

DESCRIPTION OF EMBODIMENTS

Hereinafter, embodiments of the present invention will be described with reference to the drawings.

Figure 1:
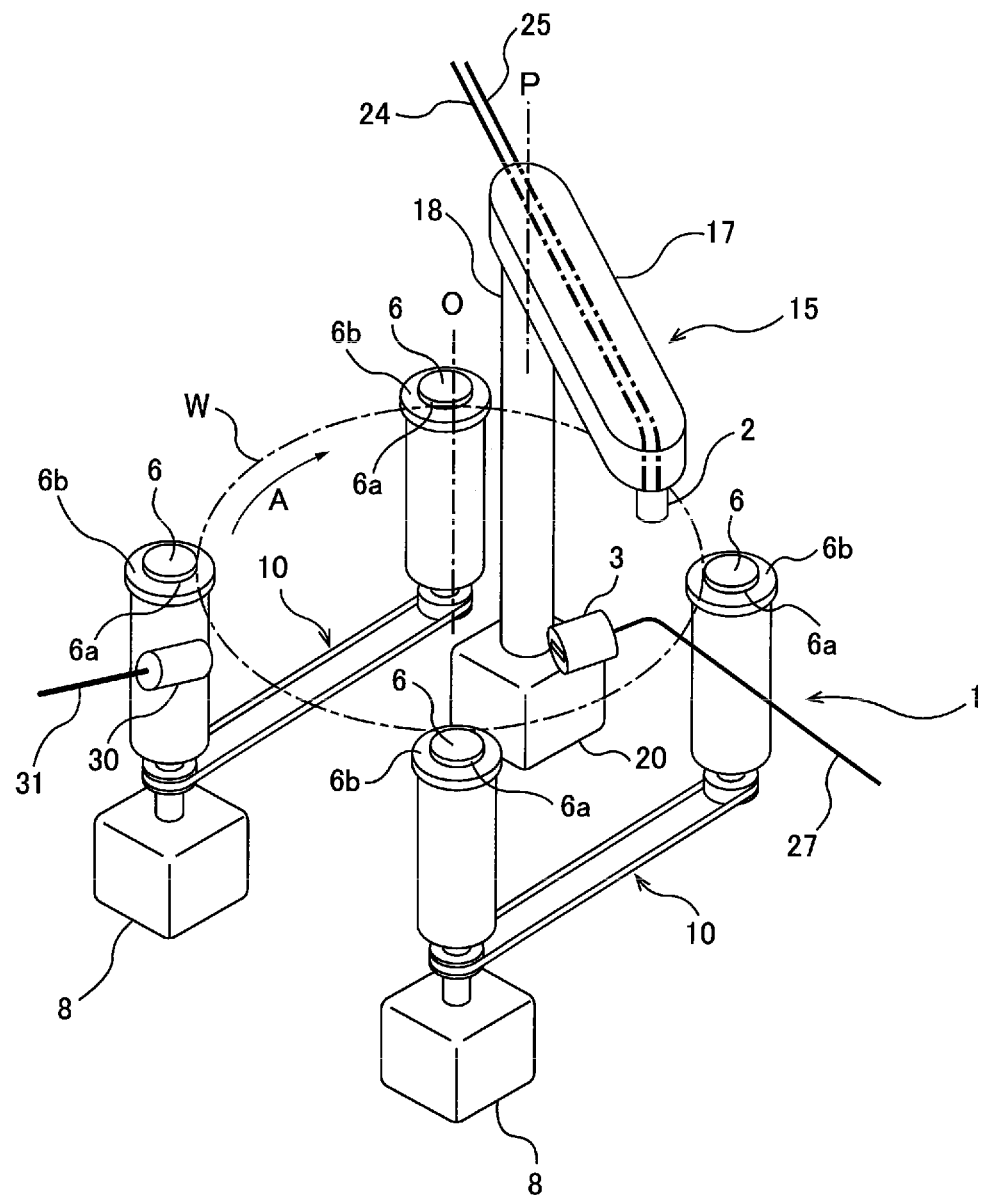
FIG. 1 is a perspective view showing an embodiment of a substrate cleaning apparatus.
Figure 2:
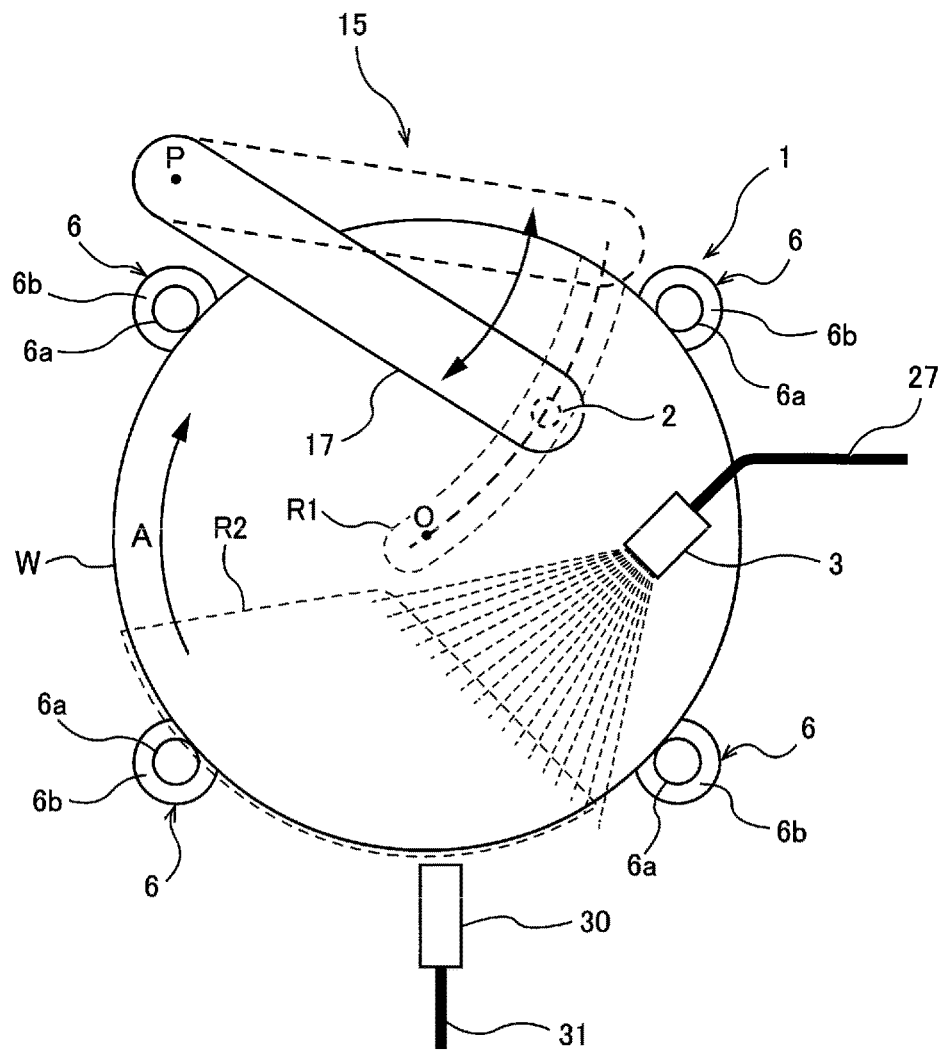
FIG. 2 is a top view of the substrate cleaning apparatus shown in FIG. 1.

FIG. 1 is a perspective view showing an embodiment of a substrate cleaning apparatus, and FIG. 2 is a top view of the substrate cleaning apparatus shown in FIG. 1. The substrate cleaning apparatus according to the present embodiment is an apparatus for cleaning a surface (or an upper surface) of a wafer W which is an example of a substrate. Hereinafter, the substrate cleaning apparatus will be described in detail.

The substrate cleaning apparatus includes a wafer holder (or a substrate holder) 1 configured to hold the wafer W and rotate the wafer W about a central axis of the wafer W in a direction indicated by arrow A, a two-fluid jet nozzle 2 configured to deliver a two-fluid jet to the surface (upper surface) of the wafer W held by the wafer holder 1, and a fan spray nozzle 3 configured to deliver a fan-shaped jet to the surface (upper surface) of the wafer W held by the wafer holder 1.

The wafer holder (substrate holder) 1 includes a plurality of holding rollers 6 configured to hold a periphery of the wafer W, and roller motors 8 configured to rotate these holding rollers 6. These holding rollers 6 are arranged around a predetermined reference axis O. In this embodiment, four holding rollers 6 are provided. The holding rollers 6 when holding the wafer W are located at the same distance from the reference axis O. Therefore, the center of the wafer W when held by the holding rollers 6 coincides with the reference axis O. In one embodiment, only three holding rollers 6 may be provided, or five or more holding rollers 6 may be provided. The wafer W to be cleaned is placed on the holding rollers 6 by a transfer device (not shown), and is rotated by the holding rollers 6 in the direction indicated by the arrow A in FIG. 2.

Figure 3:
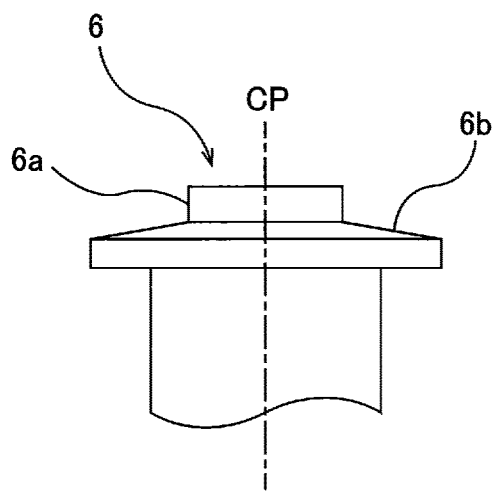
FIG. 3 is an enlarged side view of a holding roller.

FIG. 3 is an enlarged side view of the holding roller 6. Each holding roller 6 has a cylindrical substrate holding surface (wafer holding surface) 6a and a tapered portion 6b inclined downward along a radially outward direction. The tapered portion 6b is connected to a lower end of the substrate holding surface 6a and extends radially outwardly from the substrate holding surface 6a. The tapered portion 6b is circular and concentric with the substrate holding surface 6a. The center of the tapered portion 6b and the center of the substrate holding surface 6a are on a central axis CP of the holding roller 6. The holding roller 6 is configured to be rotatable about its central axis CP.

Figure 4A:
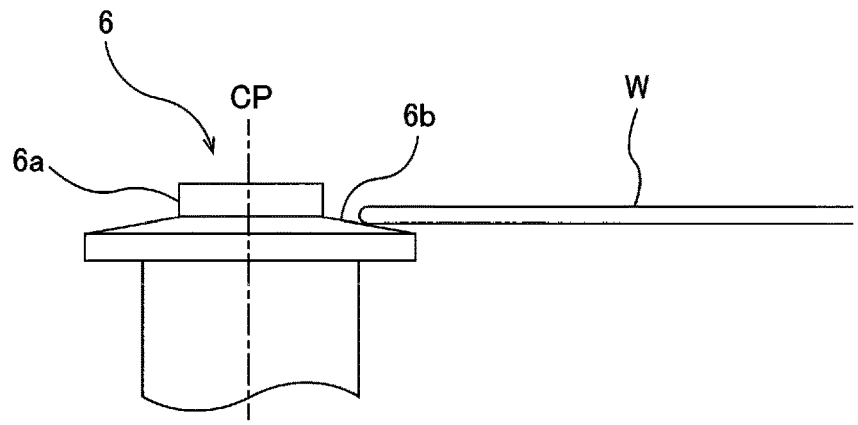
FIG. 4A is a diagram showing a state in which a wafer is placed on the holding roller but is not held by the holding roller.
Figure 4B:
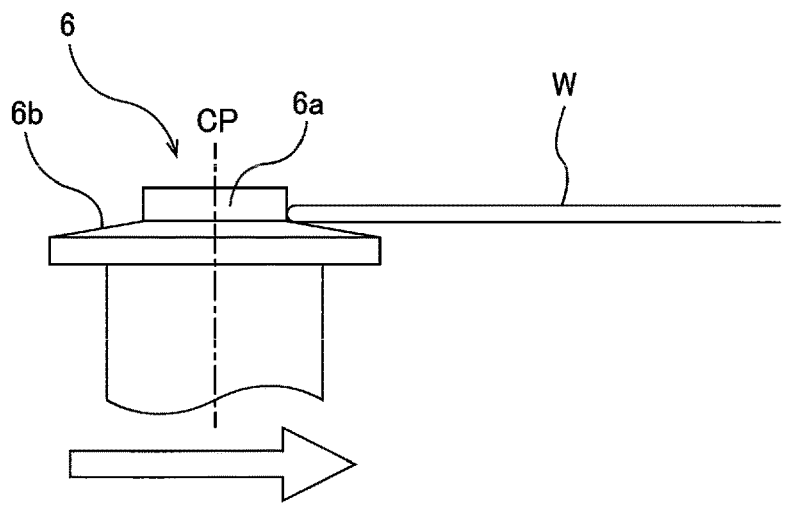
FIG. 4B is a diagram showing a state in which a periphery of the wafer is held by a substrate holding surface of the holding roller.

FIG. 4A is a diagram showing a state in which the wafer W is placed on the holding roller 6 but is not held by the holding roller 6. As shown in FIG. 4A, the periphery of the wafer W is placed on the tapered portion 6b of the holding roller 6 by the transfer device (not shown). Thereafter, as shown in FIG. 4B, the entire holding roller 6 moves in a direction indicated by arrow, until the substrate holding surface 6a of the holding roller 6 comes into contact with the periphery of the wafer W, whereby the periphery of the wafer W is held by the substrate holding surface 6a. When the holding roller 6 rotates about the central axis CP with the periphery of the wafer W being in contact with the substrate holding surface 6a, the wafer W rotates. Each holding roller 6 rotates about each central axis CP, while the position of each holding roller 6 itself is fixed.

Referring back to FIG. 1, two of the four holding rollers 6 are coupled to each other by a torque transmission mechanism 10, and the other two holding rollers 6 are also coupled to each other by another torque transmission mechanism 10. Each torque transmission mechanism 10 is composed of, for example, a combination of pulleys and a belt. In this embodiment, two roller motors 8 are provided. One of the two roller motors 8 is coupled to the two holding rollers 6 which are coupled to each other by the torque transmission mechanism 10, and the other roller motor 8 is coupled to the other two holding rollers 6 which are coupled to each other by the other torque transmission mechanism 10.

In one embodiment, one roller motor may be coupled to all the holding rollers 6 via a torque transmission mechanism. In the present embodiment, all the holding rollers 6 are coupled to the roller motors 8, while some of the plurality of holding rollers 6 may be coupled to the roller motor(s) 8. It is preferable that at least two of the plurality of holding rollers 6 are coupled to the roller motor(s) 8.

In the present embodiment, two of the four holding rollers 6 can be moved toward and away from the other two holding rollers 6 by a moving mechanism (not shown). After the wafer W is placed on the tapered portions 6b of the four holding rollers 6 by the transfer device (not shown), the two holding rollers 6 move toward the other two holding rollers 6, until the substrate holding surfaces 6a of the four holding rollers 6 hold the periphery of the wafer W.

After cleaning of the wafer W, the two holding rollers 6 move away from the other two holding rollers 6, so that the substrate holding surfaces 6a of the four holding rollers 6 release the periphery of the wafer W, until the periphery of the wafer W is located on the tapered portions 6b of the four holding rollers 6. The wafer W is removed from the holding rollers 6 by the transfer device (not shown). In one embodiment, all the holding rollers 6 may be configured to be movable by a moving mechanism(s) (not shown).

The two-fluid jet nozzle 2 and the fan spray nozzle 3 are configured to form a two-fluid jet and a fan-shaped jet, respectively, for cleaning the surface (upper surface) of the wafer W held by the holding rollers 6. As shown in FIG. 1, the two-fluid jet nozzle 2 and the fan spray nozzle 3 are arranged so as to be oriented toward a region surrounded by the substrate holding surfaces 6a of the holding rollers 6. This region surrounded by the substrate holding surfaces 6a is a region where the wafer W is held by the holding rollers 6. Therefore, the two-fluid jet nozzle 2 and the fan spray nozzle 3 are arranged so as to be oriented toward the surface (upper surface) of the wafer W held by the substrate holding surfaces 6a of the holding rollers 6.

The substrate cleaning apparatus further includes a nozzle moving device 15 configured to translate the two-fluid jet nozzle 2. The nozzle moving device 15 includes an arm 17 holding the two-fluid jet nozzle 2, a support shaft 18 supporting the arm 17, and a pivoting motor 20 coupled to the support shaft 18. The two-fluid jet nozzle 2, the fan spray nozzle 3, and the arm 17 are located higher than the holding rollers 6. The two-fluid jet nozzle 2 and the fan spray nozzle 3 are located above the wafer W held by the holding rollers 6.

The two-fluid jet nozzle 2 is fixed to a distal end of the arm 17, and the support shaft 18 is fixed to the other end of the arm 17. The two-fluid jet nozzle 2 extends vertically and downwardly from the distal end of the arm 17. The pivoting motor 20 is configured to be able to rotate the support shaft 18 clockwise and counterclockwise by a predetermined angle. When the pivoting motor 20 rotates the support shaft 18, the arm 17 and the two-fluid jet nozzle 2 rotate or pivot clockwise and counterclockwise around a pivot axis P of the support shaft 18 by a predetermined angle.

As shown in FIG. 2, as the arm 17 pivots, the two-fluid jet nozzle 2 moves in an arc-shaped path extending through the center of the wafer W (corresponding to the reference axis O) held by the holding rollers 6. More specifically, during cleaning of the wafer W, the two-fluid jet nozzle 2 oscillates (or reciprocates) between the center of the wafer W and the periphery of the wafer W. The moving direction of the two-fluid jet nozzle 2 is substantially the radial direction of the wafer W.

The two-fluid jet nozzle 2 is perpendicular to the surface (upper surface) of the wafer W when the wafer W is held by the holding rollers 6. In the present embodiment, the central axes of the holding rollers 6 and the two-fluid jet nozzle 2 extend in the vertical direction, and the wafer W is held horizontally by the holding rollers 6. In one embodiment, the central axes of the holding rollers 6 may be inclined with respect to the vertical direction, and the wafer W may be held by the holding rollers 6 in an inclined state.

The two-fluid jet nozzle 2 is coupled to a gas supply line 24 that supplies a gas, such as air or an inert gas (for example, nitrogen gas), and a liquid supply line 25 that supplies a first liquid, such as pure water or carbonated water. The gas supply line 24 is coupled to a gas supply source (not shown), and the liquid supply line 25 is coupled to a liquid supply source (not shown). The two-fluid jet nozzle 2 is configured to form a two-fluid jet composed of a mixture of the first liquid and the gas. The two-fluid jet is emitted from the two-fluid jet nozzle 2 perpendicularly to the surface (upper surface) of the wafer W.

As shown in FIG. 2, as the two-fluid jet nozzle 2 oscillates, the two-fluid jet is delivered to a first region R1 of the surface of the wafer W. This first region R1 is an elongated region or a strip-shaped region extending in the radial direction of the wafer W. The first region R1 includes the center of the wafer W. The two-fluid jet can collide perpendicularly with the surface of the wafer W and can remove particles from the surface of the wafer W. During cleaning of the wafer W, each holding roller 6 rotates about each central axis CP (see FIG. 3), but the position of each holding roller 6 itself is fixed. Therefore, the two-fluid jet does not collide with the holding rollers 6, and the liquid constituting the two-fluid jet is not scattered.

The fan spray nozzle 3 is fixed to a holding member, such as a bracket (not shown). Therefore, unlike the two-fluid jet nozzle 2, the position of the fan spray nozzle 3 is fixed during cleaning of the wafer W. The fan spray nozzle 3 is coupled to a liquid supply line 27 that supplies a second liquid, such as pure water, an alkaline liquid, or a liquid containing a surfactant. The fan spray nozzle 3 is configured to form a fan-shaped jet of the second liquid that has been supplied through the liquid supply line 27.

The fan spray nozzle 3 is located outwardly of the path of the two-fluid jet nozzle 2, and is arranged such that the two-fluid jet nozzle 2, which moves together with the arm 17, does not collide with the fan spray nozzle 3. The emission of the fan-shaped jet begins at the same time as or after the emission of the two-fluid jet begins. The emission of the fan-shaped jet is stopped at the same time as or after the emission of the two-fluid jet is stopped.

The fan spray nozzle 3 is arranged so as to be oriented diagonally downward. As shown in FIG. 2, the fan-shaped jet is a wide jet that spreads in lateral direction, and has a substantially constant flow-velocity distribution from one end to other end of the fan-shaped jet. In the present embodiment, a width direction of the fan-shaped jet is along the radial direction of the wafer W. An outer end of the fan-shaped jet is located outwardly of the wafer W. A width of the fan-shaped jet is at least three-quarters of a radius of the wafer W. In one embodiment, the width of the fan-shaped jet is greater than the radius of the wafer W.

The fan-shaped jet is obliquely incident on the surface of the wafer W and forms a flow of the second liquid on the surface (upper surface) of the wafer W. This flow of the second liquid is formed on a second region R2 including the periphery of the wafer W. The second region R2 is located away from the above-mentioned first region R1. It is advantageous that the fan spray nozzle 3 allows the second liquid to contact a wider area of the wafer W and can form the flow of the second liquid having a uniform flow rate on the wafer W, as compared with a conical spray nozzle that sprays a conical liquid jet.

As shown in FIG. 2, the fan spray nozzle 3 is oriented in a direction along the rotating direction of the wafer W indicated by the arrow A as viewed from above, and is arranged to so as to form the fan-shaped jet toward the outside of the wafer W. The fan spray nozzle 3 is oriented in the direction in which the fan-shaped jet does not collide with the two-fluid jet. Specifically, the fan-shaped jet emitted from the fan spray nozzle 3 is formed at a position away from the two-fluid jet emitted from the two-fluid jet nozzle 2. Since the fan spray nozzle 3 is arranged at such position, the two-fluid jet can collide with the surface of the wafer W without being hindered by the fan-shaped jet, and can therefore remove particles from the surface of the wafer W.

In particular, according to the present embodiment, the fan spray nozzle 3 is oriented in the direction such that both the fan-shaped jet emitted from the fan spray nozzle 3 and the flow of the second liquid formed on the surface (upper surface) of the wafer W do not collide with the two-fluid jet emitted from the two-fluid jet nozzle 2. The two-fluid jet can collide with the surface of the wafer W and can remove particles from the surface of the wafer W without being hindered by the fan-shaped jet and the flow of the second liquid on the wafer W.

Figure 5:
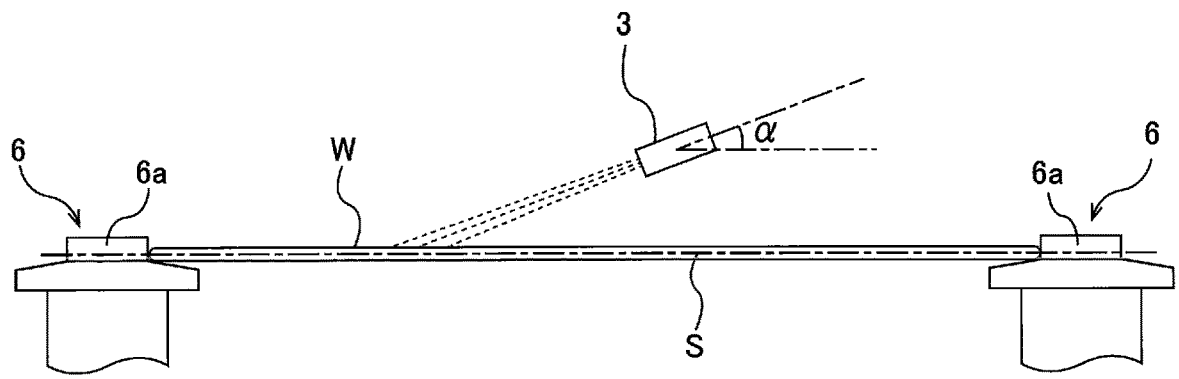
FIG. 5 is a side view showing a fan spray nozzle as viewed from a direction parallel to an upper surface of the wafer.

FIG. 5 is a side view showing the fan spray nozzle 3 as viewed from a direction parallel to the upper surface of the wafer W. The fan spray nozzle 3 is inclined with respect to the surface (upper surface) of the wafer W. If an angle of the fan spray nozzle 3 is too large, an action of the fan-shaped jet stemming the particles becomes dominant over an action of the fan-shaped jet washing away the particles, and the particles cannot be efficiently discharged from the wafer W. From this point of view, in one embodiment, an angle α of the fan spray nozzle 3 with respect to the surface (upper surface) of the wafer W is in a range of 15° to 45°. In one embodiment, the angle α of the fan spray nozzle 3 is 30°. The wafer W is held by the substrate holding surfaces 6a of the four holding rollers 3 (only the two holding rollers 3 are shown in FIG. 5), and the surface (upper surface) of the wafer W is parallel to a plane S (which is an imaginary plane) extending through these substrate holding surfaces 6a. Therefore, the angle α of the fan spray nozzle 3 with respect to the plane (imaginary surface) S extending through the substrate holding surfaces 6a is in the range of 15° to 45°.

The fan-shaped jet emitted from the fan spray nozzle 3 inclined in this way is also incident on the surface (upper surface) of the wafer W at substantially the same angle as the fan spray nozzle 3. The fan-shaped jet forms the flow of the second liquid on the wide second region R2 of the surface of the wafer W. The flow of the second liquid travels toward the outside of the wafer W, can wash out the particles lifted by the two-fluid jet, and can prevent the semidry of the wafer W.

As shown in FIG. 2, the substrate cleaning apparatus further includes a rinsing nozzle 30 that supplies a rinsing liquid to the surface (upper surface) of the wafer W held by the holding rollers 6. The rinsing nozzle 30 is arranged so as to be oriented toward the center of the surface of the wafer W, i.e., the reference axis O. The rinsing nozzle 30 is coupled to a rinsing-liquid supply line 31 that supplies the rinsing liquid, such as pure water. After cleaning of the wafer W with the two-fluid jet and cleaning of the wafer W with the fan-shaped jet are terminated, the rinsing liquid is supplied from the rinsing nozzle 30 to the rotating wafer W to rinse the entire surface of the wafer W.

Figure 6:
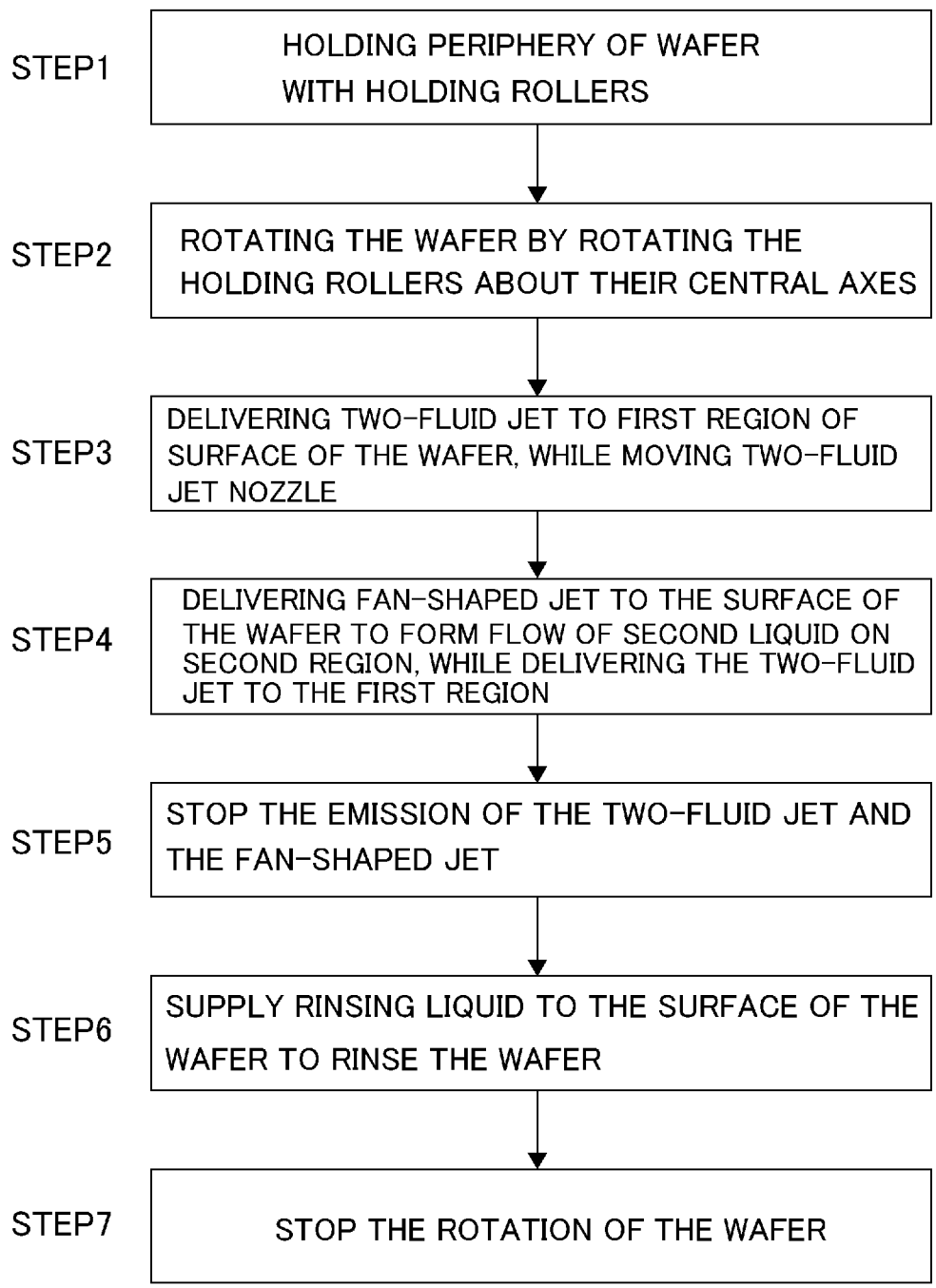
FIG. 6 is a flowchart illustrating an embodiment of a wafer cleaning operation.

Next, an embodiment of the cleaning operation for the wafer W will be described with reference to a flowchart shown in FIG. 6.

In step 1, the periphery of the wafer W is held by the holding rollers 6. As shown in FIG. 4B, the periphery of the wafer W is held by each substrate holding surface 6a of each holding roller 6.

In step 2, the roller motors 8 shown in FIG. 1 are set in motion to rotate the holding rollers 6 about the respective central axes CP. The wafer W is rotated about the central axis of the wafer W by the rotating holding rollers 6.

In step 3, while the two-fluid jet nozzle 2 is moving in the radial direction of the wafer W, the two-fluid jet composed of a mixture of the first liquid and the gas is delivered from the two-fluid jet nozzle 2 to the first region R1 of the surface (upper surface) of the wafer W. The two-fluid jet nozzle 2 reciprocates between the center of the rotating wafer W and the periphery of the wafer W by a predetermined number of times.

In step 4, when the two-fluid jet is delivered to the first region R1, the fan-shaped jet composed of the second liquid is delivered from the fan spray nozzle 3 to the surface of the wafer W, so that the flow of the second liquid is formed on the second region R2 of the surface of the wafer W. The emission of the fan-shaped jet begins at the same time as or after the emission of the two-fluid jet begins. Therefore, the steps 3 and 4 are performed substantially simultaneously.

In step 5, the emission of the two-fluid jet is stopped, and at the same time or thereafter, the emission of the fan-shaped jet is stopped.

In step 6, the rinsing liquid is supplied from the rinsing nozzle 30 to the surface (upper surface) of the wafer W while the rotation of the wafer W is maintained, whereby the surface of the wafer W is rinsed with the rinsing liquid.

In step 7, the roller motors 8 are stopped, whereby the rotation of the wafer W is stopped.

Figure 7:
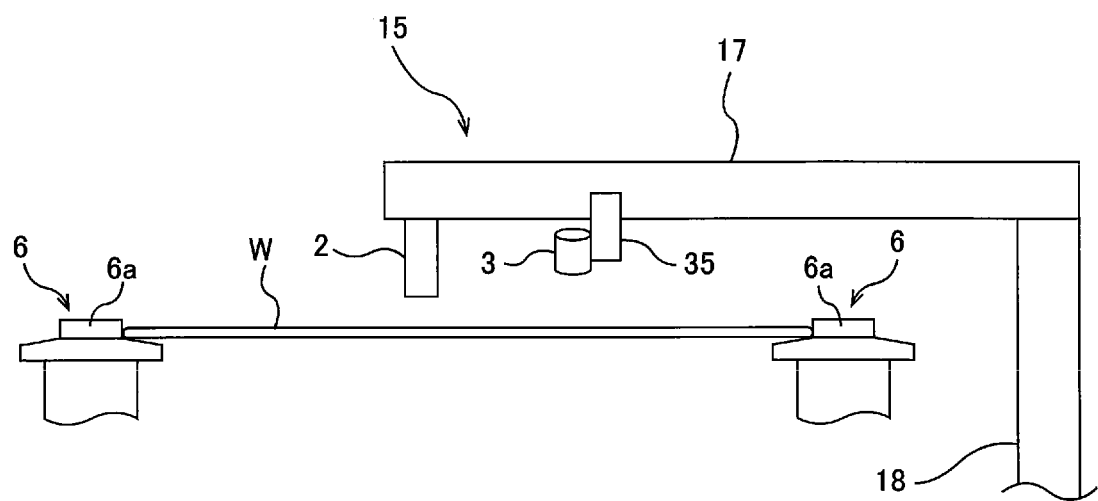
FIG. 7 is a side view showing another embodiment of the substrate cleaning apparatus.
Figure 8:
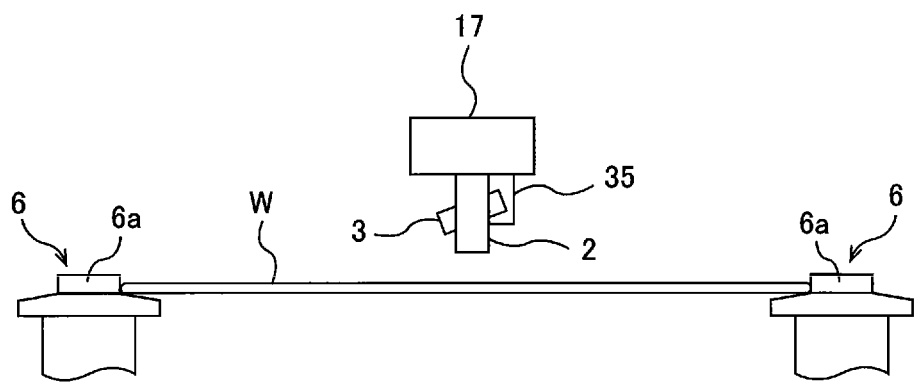
FIG. 8 is a view of a two-fluid jet nozzle and a fan spray nozzle shown in FIG. 7 as viewed from an axial direction of an arm.
Figure 9:
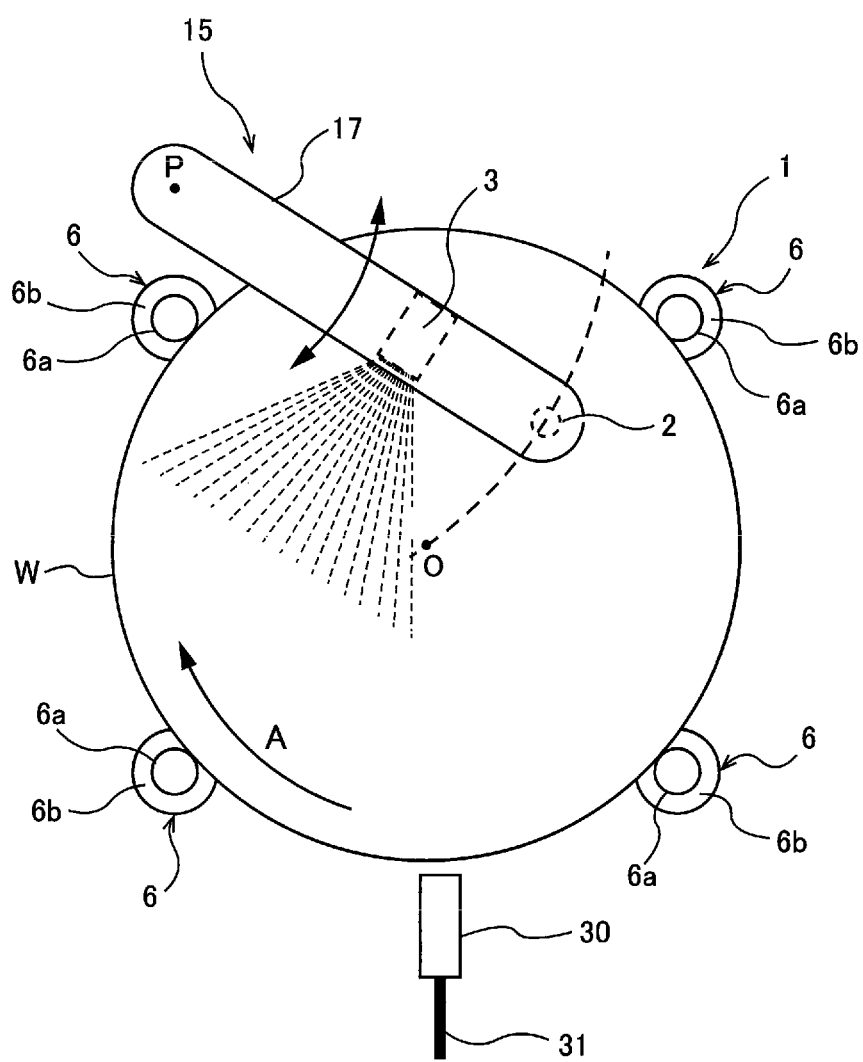
FIG. 9 is a top view of the substrate cleaning apparatus shown in FIG. 7.

Next, another embodiment of the substrate cleaning apparatus will be described with reference to FIGS. 7 to 9. Configurations and operations of the present embodiment, which will not be particularly described, are the same as those of the above-described embodiments, and therefore duplicated descriptions thereof will be omitted. FIG. 7 is a side view showing another embodiment of the substrate cleaning apparatus, and FIG. 8 is a view of two-fluid jet nozzle 2 and fan spray nozzle 3 shown in FIG. 7 as viewed from axial direction of arm 17. FIG. 9 is a top view of the substrate cleaning apparatus shown in FIG. 7. Although some components are note depicted in FIGS. 7 to 9, the configurations of the present embodiment are the same as those of the above-described embodiments unless otherwise described.

In the present embodiment, the nozzle moving device 15 is configured to translate the two-fluid jet nozzle 2 and the fan spray nozzle 3 together. Both the two-fluid jet nozzle 2 and the fan spray nozzle 3 are held by the arm 17. The fan spray nozzle 3 is attached to a bracket 35 fixed to the arm 17. In one embodiment, the fan spray nozzle 3 may be fixed directly to the arm 17. Since the fan spray nozzle 3 is coupled to the arm 17 in this way, the two-fluid jet nozzle 2 and the fan spray nozzle 3 move together with the pivoting motion of the arm 17. The fan spray nozzle 3 is located between the two-fluid jet nozzle 2 and the support shaft 18. Therefore, the fan spray nozzle 3 moves in a path different from that of the two-fluid jet nozzle 2.

As the arm 17 pivots, the two-fluid jet nozzle 2 and the fan spray nozzle 3 deliver the two-fluid jet and the fan-shaped jet to the surface (upper surface) of the wafer W. The fan spray nozzle 3 is oriented in a direction perpendicular to the extending direction of the arm 17 as viewed from above. Therefore, the fan spray nozzle 3 emits the fan-shaped jet in the moving direction of the fan spray nozzle 3 as viewed from above. The fan spray nozzle 3 is arranged away from the two-fluid jet nozzle 2 at a distance such that the fan-shaped jet does not collide with the two-fluid jet. Specifically, the fan spray nozzle 3 emits the fan-shaped jet in a direction away from the two-fluid jet nozzle 2 and the two-fluid jet, so that the fan-shaped jet does not collide with the two-fluid jet. The inclination angle of the fan spray nozzle 3 is the same as the angle described with reference to FIG. 5.

In the present embodiment, the fan spray nozzle 3 can deliver the fan-shaped jet of the second liquid to the surface (upper surface) of the wafer W while the fan spray nozzle 3 is moving. Therefore, the flow of the second liquid can be formed over a wide area on the surface (upper surface) of the wafer W. The flow of the second liquid can wash out the particles lifted by the two-fluid jet and can prevent the semidry of the wafer W.

Figure 10:
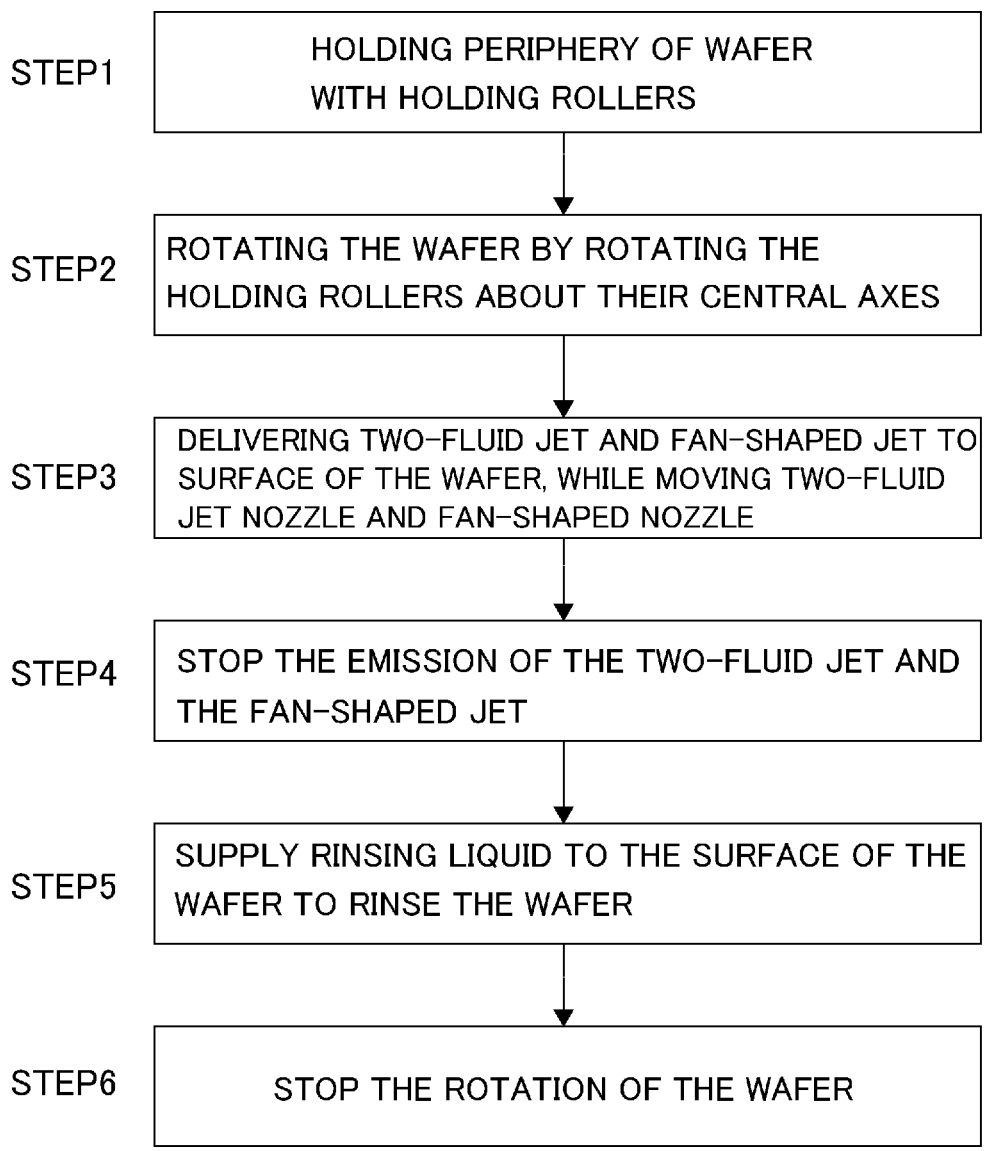
FIG. 10 is a flowchart illustrating an embodiment of a wafer cleaning operation.

Next, an embodiment of the cleaning operation for the wafer W will be described with reference to a flowchart shown in FIG. 10.

In step 1, the periphery of the wafer W is held by the holding rollers 6. As shown in FIG. 4B, the periphery of the wafer W is held by each substrate holding surface 6a of each holding roller 6.

In step 2, the roller motors 8 shown in FIG. 1 are set in motion to rotate the holding rollers 6 about the respective central axes CP. The wafer W is rotated about the central axis of the wafer W by the rotating holding rollers 6.

In step 3, the arm 17 pivots around the support shaft 18 to move the two-fluid jet nozzle 2 and the fan spray nozzle 3 together, while the fluid jet nozzle 2 delivers the two-fluid jet composed of a mixture of the first liquid and the gas to the surface (upper surface) of the wafer W, and the fan spray nozzle 3 delivers the fan-shaped jet of the second liquid to the surface (upper surface) of the wafer W. The moving direction of the two-fluid jet nozzle 2 is the radial direction of the wafer W. The emission of the fan-shaped jet begins at the same time as or after the emission of the two-fluid jet begins. The two-fluid jet nozzle 2 reciprocates between the center of the rotating wafer W and the periphery of the wafer W by a predetermined number of times.

In step 4, the emission of the two-fluid jet is stopped, and at the same time or thereafter, the emission of the fan-shaped jet is stopped.

In step 5, the rinsing liquid is supplied from the rinsing nozzle 30 to the surface (upper surface) of the wafer W while the rotation of the wafer W is maintained, whereby the surface of the wafer W is rinsed with the rinsing liquid.

In step 6, the roller motors 8 are stopped, whereby the rotation of the wafer W is stopped.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a substrate cleaning method and a substrate cleaning apparatus for cleaning a substrate, such as a wafer.

REFERENCE SIGNS LIST 1 wafer holder (substrate holder)
2 two-fluid jet nozzle
3 fan spray nozzle
6 holding roller
6a substrate holding surface (wafer holding surface)
6b tapered portion
8 roller motor
10 torque transmission mechanism
15 nozzle moving device
17 arm
18 support shaft
20 pivoting motor
24 gas supply line
25 gas liquid line
27 gas liquid line
30 rinsing nozzle
31 rinsing-liquid supply line
35 bracket

The invention claimed is:

1. A substrate cleaning method comprising:
   rotating the substrate about its central axis;
   delivering a two-fluid jet from a two-fluid jet nozzle to a first region in a surface of the substrate while moving the two-fluid jet nozzle in a radial direction of the substrate, the two-fluid jet being composed of a mixture of a first liquid and a gas; and
   when the two-fluid jet is being delivered to the surface of the substrate, delivering a fan-shaped jet of a second liquid from a spray nozzle to a second region on the surface of the substrate to form a flow of the second liquid on the surface of the substrate, the second region being downstream of the first region in a rotating direction of the substrate, the second region being located away from the first region, the spray nozzle being located directly above the substrate to form the flow of the second liquid that is directed from an inside of the substrate toward an outside of the substrate, the second nozzle positioned to direct the fan-shaped jet of the second liquid to flush out particles that have lifted from the substrate by the two-fluid jet while keeping the surface of the wafer from becoming semi-dry.

2. The substrate cleaning method according to claim 1, wherein an angle of the spray nozzle with respect to the surface of the substrate is in a range of 15° to 45°.

3. The substrate cleaning method according to claim 1, wherein a width of the fan-shaped jet is at least three-quarters of a radius of the substrate.

4. The substrate cleaning method according to claim 1, wherein a direction of the fan-shaped jet is oriented toward an outside of the substrate.

5. The substrate cleaning method according to claim 1, wherein the spray nozzle is located above the substrate.

6. The substrate cleaning method according to claim 1, wherein delivering the fan-shaped jet comprises delivering the fan-shaped jet from the spray nozzle to the surface of the substrate to form the flow of the second liquid on the surface of the substrate while moving the spray nozzle.

7. The substrate cleaning method according to claim 6, wherein the two-fluid jet nozzle and the spray nozzle are fixed to a common arm.

* * * * *